United States Patent
Wen

(10) Patent No.: US 6,198,419 B1
(45) Date of Patent: Mar. 6, 2001

(54) METHOD AND APPARATUS FOR EXTENDING THE SPURIOUS FREE DYNAMIC RANGE OF A DIGITAL-TO-ANALOG CONVERTER

(75) Inventor: Jack Chi-Chieh Wen, Parsippany Township, Morris County, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/099,027

(22) Filed: Jun. 17, 1998

(51) Int. Cl.[7] .................................................. H03M 1/66
(52) U.S. Cl. ............................................ 341/145; 341/118
(58) Field of Search .................................. 341/118, 120, 341/144, 145, 139, 142; 330/135, 149

(56) References Cited

U.S. PATENT DOCUMENTS

| | | | | |
|---|---|---|---|---|
| 4,441,199 | * | 4/1984 | Chester et al. ...................... | 328/171 |
| 4,544,911 | * | 10/1985 | Altman et al. ...................... | 341/118 |
| 4,580,105 | | 4/1986 | Myer .................................. | 330/149 |
| 4,583,049 | | 4/1986 | Powell ................................ | 330/151 |
| 4,591,832 | * | 5/1986 | Fling et al. ......................... | 341/141 |
| 4,868,571 | * | 9/1989 | Inamasu ............................. | 341/118 |
| 4,885,551 | | 12/1989 | Myer .................................. | 330/52 |
| 4,926,136 | | 5/1990 | Olver ................................. | 330/149 |
| 4,972,188 | * | 11/1990 | Clement et al. .................... | 341/118 |
| 4,998,108 | * | 3/1991 | Ginthner et al. ................... | 341/145 |
| 5,012,490 | | 4/1991 | Myer .................................. | 375/58 |
| 5,148,163 | * | 9/1992 | Frindle ............................... | 341/131 |
| 5,179,728 | * | 1/1993 | Sowadski ........................ | 455/183.1 |
| 5,210,633 | * | 5/1993 | Trisno ................................ | 359/194 |
| 5,258,722 | * | 11/1993 | Jeffers ................................ | 330/149 |
| 5,304,945 | | 4/1994 | Myer .................................. | 330/149 |
| 5,371,481 | * | 12/1994 | Tiitanen et al. .................... | 332/103 |

(List continued on next page.)

FOREIGN PATENT DOCUMENTS 3-089627  4/1991  (JP) .

OTHER PUBLICATIONS

"Enhancing the Dynamic Range of Analog–to–Digital Converters by Reducing Excess Noise," Seifert E., et al. Proceedings of the Pacific Rim Conference on Communications, Computers and Signal Proceeding, Victoria, Jun. 1, 1989, pp. 574–576.

* cited by examiner

Primary Examiner—Peguy JeanPierre

(57) ABSTRACT

A DAC system provides an expanded SFDR when compared to the SFDR of an individual DAC(s) that makes up the DAC system. The DAC system uses a clipping arrangement which receives the digital input signal and provides an amplitude-limited signal and resulting signal distortion to a first DAC for digital input signals whose amplitudes would result in an insufficient SFDR for the first DAC. By amplitude-limiting the digital input signal, the amplitude of the digital input signal is effectively reduced or "clipped," thereby improving the SFDR performance for the first DAC. The signal distortion resulting from the amplitude adjustment is routed to a second DAC. The first DAC converts the amplitude-limited digital signal to an analog signal with an expanded SFDR due to the lower amplitude of the adjusted digital signal. The second DAC receives the signal distortion which can be viewed as the clipped amplitude portion of the digital input signal. The second DAC converts the signal distortion, which typically has a lower amplitude than the adjusted digital signal, to an analog signal with at least an acceptable SFDR. The DAC system combines the resulting analog signals from the first and second DACs to produce the desired converted analog signal with an increased relative difference between the amplitudes of the output signal and the spurious distortion, thereby providing an extended SFDR for the DAC system when compared to the SFDR if the digital input signal had been converted by the first DAC without amplitude adjustment.

32 Claims, 6 Drawing Sheets

U.S. PATENT DOCUMENTS

| | | | |
|---|---|---|---|
| 5,430,893 | 7/1995 | Myer | 455/209 |
| 5,619,168 | 4/1997 | Myer | 330/149 |
| 5,760,726 | | | |
| 5,847,603 * | 6/1998 | Koifman et al. | 341/145 |
| | 12/1998 | Myer | 330/52 |
| 5,914,682 * | 6/1999 | Noguchi | 341/145 |
| 6,025,758 * | 2/2000 | Lu | 332/100 |

METHOD AND APPARATUS FOR EXTENDING THE SPURIOUS FREE DYNAMIC RANGE OF A DIGITAL-TO-ANALOG CONVERTER

BACKGROUND OF THE INVENTION

1. Field of the Invention

This invention relates to digital-to-analog converters and, more particularly, to a digital-to-analog converter with an extended spurious free dynamic range (SFDR).

2. Description of Related Art

Many physical devices generate output signals which are analog or continuously varying. Today, signal processing is often accomplished using digital methods, and the processed signal is often converted back to analog form. Many types of converters exist which act as interfaces between analog devices and digital systems. These converters are used in a variety of applications, including testing, measurement, process control, and communications. Digital-to-analog converters (DAC) produce an analog output from a given digital input. The spurious free dynamic range (SFDR) for the DAC is often measured as the difference in decibels (dB) between the amplitude of the spurious distortion, such as intermodulation products, and the amplitude of the highest output signal. The SFDR performance of a DAC varies as a function of the amplitude of the digital signal to be converted. Usually, the greater the amplitude of the digital signal, the smaller the SFDR because as the amplitude of the digital signal increases, the amplitude of the analog output signal increases, but the amplitude of the resulting spurious distortion generally increases more than the amplitude of the output signal. Depending on the application, extending the SFDR of the DAC can enable the DAC to convert a greater range of digital signals to analog signals while maintaining or reducing the level of spurious distortion or to convert a given range of digital signals to analog signals while reducing the level of spurious distortion. For example, for discussion purposes, a 16 bit DAC could have a spurious free dynamic range of 90 dB measured by a high output level of 4 dBm and the spurious distortion level at −86 dBm. By increasing the relative difference between the amplitudes of the worst case spurious distortion and the high output signal, the SFDR of the DAC can be extended.

SUMMARY OF THE INVENTION

The present invention involves a DAC system which provides an expanded SFDR when compared to the SFDR of an individual DAC(s) that makes up the DAC system. The DAC system uses a clipping arrangement which receives the digital input signal and provides an amplitude-limited signal and resulting signal distortion to a first DAC for digital input signals whose amplitudes would result in an insufficient SFDR for the first DAC. By amplitude-limiting the digital input signal, the amplitude of the digital input signal is effectively reduced or "clipped," thereby improving the SFDR performance for the first DAC. The signal distortion resulting from the amplitude adjustment is routed to a second DAC. The first DAC converts the amplitude-limited digital signal to an analog signal with an expanded SFDR due to the lower amplitude of the adjusted digital signal. The second DAC receives the signal distortion which can be viewed as the clipped amplitude portion of the digital input signal. The second DAC converts the signal distortion, which typically has a lower amplitude than the adjusted digital signal, to an analog signal with at least an acceptable SFDR. The DAC system combines the resulting analog signals from the first and second DACs to produce the desired converted analog signal with an increased relative difference between the amplitudes of the output signal and the spurious distortion, thereby providing an extended SFDR for the DAC system when compared to the SFDR if the digital input signal had been converted by the first DAC without amplitude adjustment.

In certain embodiments, the DAC system receives a digital input signal of N bits. The clipping arrangement involves routing an amplitude-limited portion of the digital input signal comprising the n2 most significant bits (MSBs) of the digital input signal to the first DAC for converting to analog form. The DAC system routes the clipped amplitude portion of the digital input signal comprising n1 bits to a second DAC for converting to analog form. The number n1 of least significant bits (LSBs) which are routed to the second DAC from the total number of N bits of the digital input signal reflects the amount of amplitude "clipping" of the digital input signal. The more LSBs which are routed to the second DAC, the lower the amplitude of the amplitude-limited portion of the digital input signal which is routed to the first DAC. By providing a lower amplitude digital signal with signal distortion to the first DAC, the SFDR of the first DAC is expanded. The SFDR of the second DAC is generally not a problem because the amplitude of the clipped portion or signal distortion portion of the digital input signal can be designed to produce an acceptable spurious distortion level from the second DAC. The DAC system then combines the analog outputs from the first and second DACs to produce the desired converted signal with a reduced spurious distortion level and therefore an expanded SFDR.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
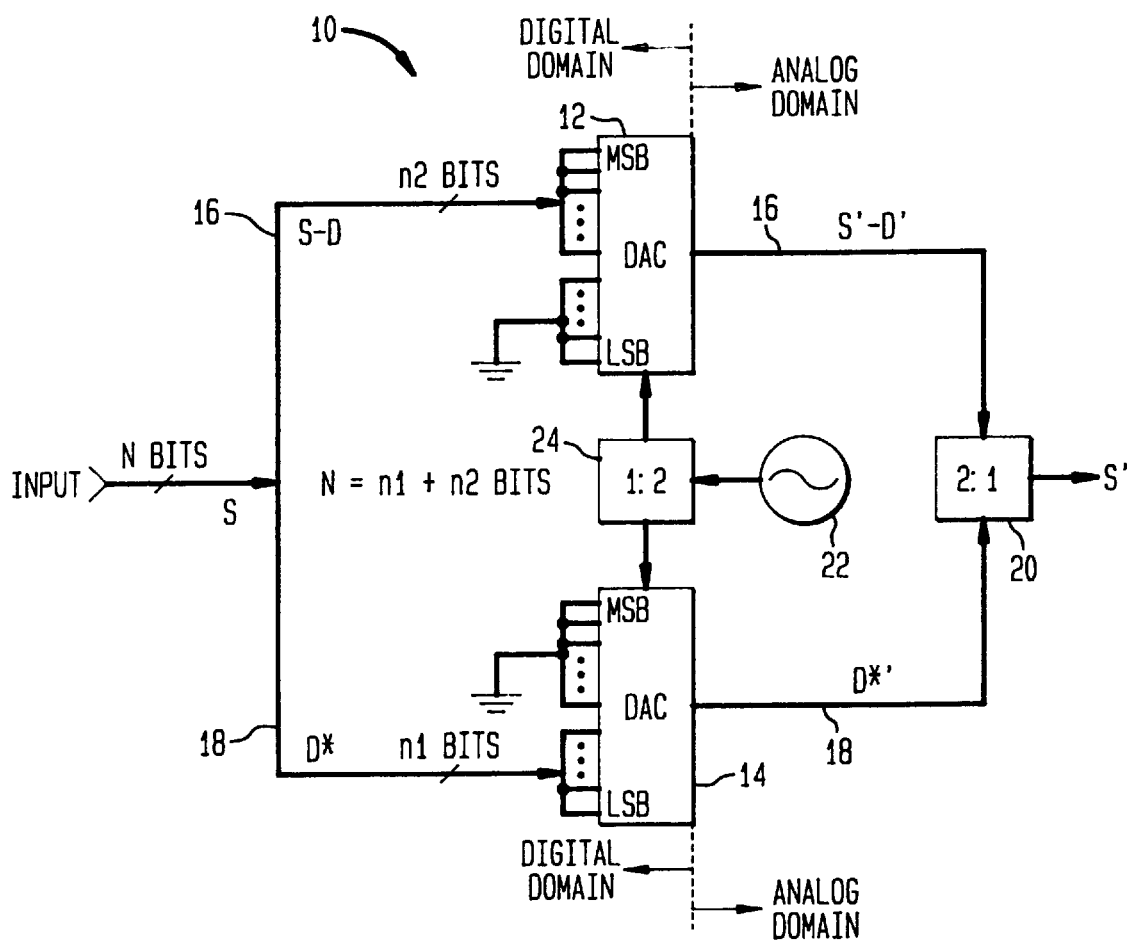
FIG. 1 shows a general block diagram of an embodiment of the DAC system with extended dynamic range according to the principles of the present invention.

For pedagogic purposes, the invention is described below with respect to exemplary embodiments of the DAC system with an expanded spurious free dynamic range (SFDR). With particular reference to FIG. 1, a DAC system 10 receives a digital signal S having N bits which is to be converted into analog form. In this instance, the signal S has an amplitude which would create a particular SFDR for a first DAC 12 in that the converting of the signal S by the first DAC 12 would generate a corresponding level of spurious distortion relative to the amplitude of the converted signal S. Amplitude can be measured in many ways, such as voltage, current, energy, power or intensity, but for discussion purposes, amplitude in the digital domain can refer to the numerical value that the digital signal represents. In the frequency domain, amplitude can refer to power level, and in the time domain, amplitude can refer to voltage level. The sufficiency of the SFDR is a design choice depending on the particular application. In a typical digital to analog converter, the SFDR is generally defined for a given amplitude of the analog output signal as the difference between the amplitude of the analog output signal and the amplitude of the spurious distortion produced therewith. Typically, as the amplitude of the output signal increases, the difference between the spurious distortion and the output signal decreases. As such, the SFDR can be defined relative to the highest output signal level and the corresponding spurious distortion level. In general, extending the spurious free dynamic range results if the power level of spurious distortion is reduced for a given analog output signal level, or the output signal power level is increased for a given power level of spurious distortion generated, or the relative difference increases between the amplitudes of the output signal and the corresponding spurious distortion. For example, if the power level of an analog output signal from the first DAC 12 would be generated with a certain level of distortion, the DAC system 10 provides an expanded SFDR by generating the same output signal level with a reduced level of distortion.

In FIG. 1, the DAC system 10 routes a first or amplitude-limited portion comprising n2 bits of the digital input signal S of N bits onto a first path 16 to the first DAC 12 which converts the first portion into analog form. The composite signal S and signal distortion D (S-D) resulting from the clipping of the digital input signal S comprises only the most significant bits (MSB) of the digital input signal S. The signal distortion D is relative to the N-bit digital input signal, and the system introduces the signal distortion D by effectively clipping the digital input signal S. The adjusted or composite digital signal on the first path 16 is shown as the signal S and signal distortion D (S-D) because only the most significant n2 bits of the digital input signal S are routed onto the first path 16. The DAC system 10 routes a second portion D* comprising n1 bits of the digital input signal S onto a second path 18 to a second DAC 14 which converts the second portion to analog form. The second or clipped amplitude portion of the digital signal S comprises the least significant bits (LSB) of the digital input signal S of N bits, where N=n1+n2 in this embodiment. By routing only the n2 MSBs onto the first path 16, the DAC 10 effectively clips the digital input signal S and routes the clipped off portion or distortion D* to the second DAC 14. The distortion D* reflects the LSBs clipped from the digital input signal S in the digital domain and are 180 degrees out of phase with the signal distortion D on the first path 16.

The number of LSBs of the digital input signal S which are routed to the second DAC 14 reflects the amount of amplitude clipping of the digital input signal S. The more LSBs which are routed to the second DAC 14, the more clipping of the digital input signal S and the lower the amplitude of the composite signal S and D which is routed to the first DAC 12. By providing a lower amplitude composite digital signal S with signal distortion D to the first DAC 12, a lower spurious distortion level is produced relative to the output signal level, thereby improving the SFDR of the first DAC 12. In this particular embodiment, the unused bits of the first DAC 12 (corresponding to the LSBs of the input signal S) are set to zero ("0"), and the unused bits of the second DAC 14 (corresponding to the MSBs of the input signal S) are set to zero ("0"). Other embodiments are possible where the number of bits which are set to zero changes depending on the input signal S. In other embodiments, the first DAC 12 could have n1 bits set to zero, and the second DAC 14 would receive n1 bits and have no bits sets to zero.

The second DAC 14 generally produces a low level of spurious distortion relative to the output signal level of the DAC 14 because the DAC 14 is generally designed to receive the clipped portion D* having a maximum amplitude that produces a low level of spurious distortion and an acceptable SFDR for the second DAC 14. The DAC system 10 combines the analog output S' and D' from the first DAC 12 and the analog output D*' from the second DAC 14, thereby producing the desired converted analog signal S' with a lower amplitude of spurious distortion when compared to the amplitude of spurious distortion if the digital signal S had been converted by the first DAC 12. As such, the DAC system 10 produces the desired converted analog signal S' with an improved SFDR.

In this particular embodiment, a 2:1 summer 20 combines the analog output S' and D' on the first path 14 from the first DAC 12 with the analog output D*' on the second path 18 from the second DAC 14. The use of other types of combiners as the summer 20 is possible. Additionally, in this particular embodiment, a sampling clock 22 provides a sampling signal to a 1:2 splitter 24. The 1:2 splitter 24 provides the sampling signal to the first DAC 12 and the second DAC 12 to provide synchronous sampling. Other sampling signal arrangements are possible for the first and second DAC 12 and 14.

By feeding forward the distortion energy D*, converting it to analog form and combining it with the analog signal S' and D' on the first path 16, the DAC system 10 is effectively reconstructing the desired converted analog signal S' using the amplitude energy which was "clipped" from the input signal S prior to digital-to-analog (D/A) conversion. Because D/A conversion is performed on lower amplitude signals on the separate paths before recombining the signals, the DAC system 10 produces the desired converted analog signal S' with an improved SFDR. The SFDR is improved because as the amplitude of the digital input signal decreases from clipping, the amplitude of the analog output signal from the first DAC 12 decreases in a corresponding amount, but the amplitude of the spurious distortion from the first DAC 12 decreases more than the amplitude of the output signal. For example, at the upper boundary of the SFDR, for every 1 dB change in output signal power level, a 3 dB change in spurious distortion power level can occur. Since the amplitude of the signal D* results in an acceptable SFDR, the second DAC 14 produces an acceptable level of spurious distortion which results in an acceptable amplitude of overall spurious distortion for the DAC system 10.

Figure 2:
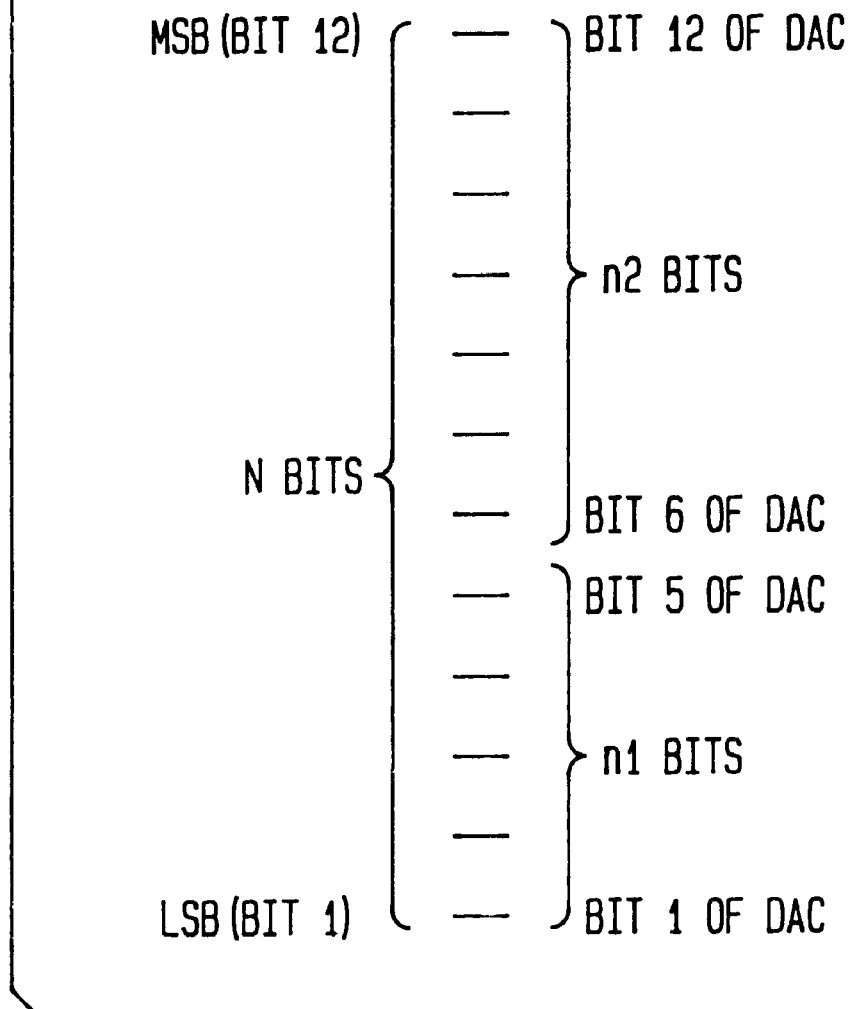
FIG. 2 shows an example N bit digital input signal to be converted by an example embodiment of the DAC system of FIG. 1.

FIG. 2 shows an example embodiment where the digital input signal S comprises twelve (12) bits. In the example embodiment, the DAC system 10 splits the 12 bits into seven (7) n2 bits on the first path 16 and five (5) n1 bits on the second path 18. Additionally, in this example embodiment, 12 bit DACs are used for the first and second DACs 12 and 14. As such, the least significant bit (bit 1) through the fifth bit are connected, respectively, to the first bit input through the fifth bit input of the second DAC 14, and the sixth bit input through the twelfth bit input are set to zero. On the first DAC 12, the first bit input through the fifth bit input are set to zero, and the sixth bit through the most significant bit (bit 12) are connected to the sixth bit input through the twelfth bit input, respectively.

Figure 3A:
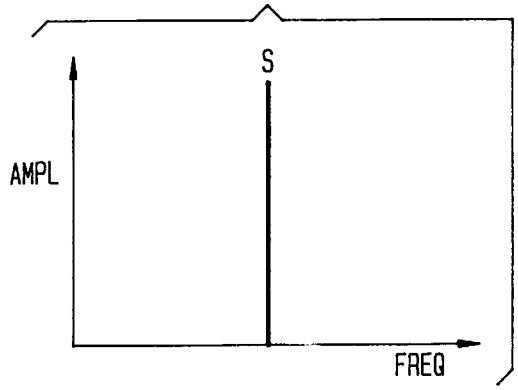
FIG. 3 are graphs for discussion purposes generally showing the spectral content of digital signals within the DAC system.
Figure 3B:
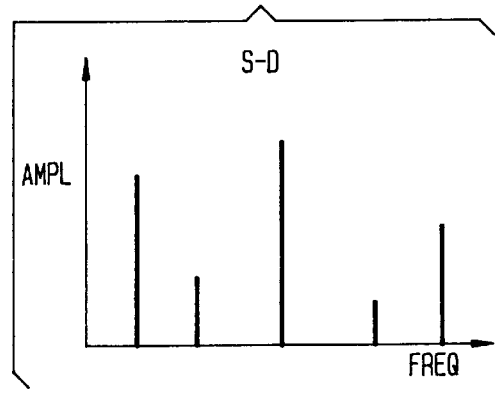
Figure 3C:
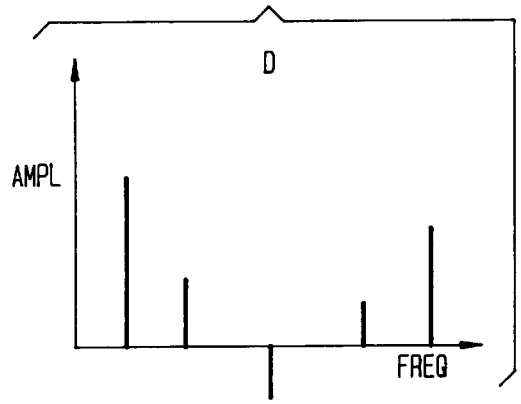
Figure 3D:
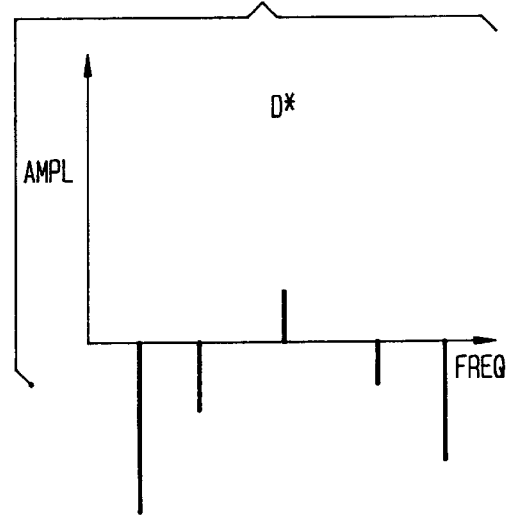

FIG. 3a shows a spectral representation of the digital input signal S for discussion purposes. By splitting or clipping the input signal S, the total amplitude of the composite signal S and D is reduced. Clipping the amplitude of the digital input signal S results in signal distortion D as shown in FIG. 3b in the frequency domain. The resulting signal distortion D (FIG. 3c) increases the frequency bandwidth of the original input signal and reduces the total amplitude of the resulting composite signal S and D. Since DACs have very good bandwidth performance, the additional bandwidth of S and D can be easily handled by the first DAC 12 (FIG. 1). Since the total amplitude for the composite signal S and D is reduced compared to the original signal S, the first DAC 12 (FIG. 1) generates converted composite signal S and D with a lower level of spurious distortion and therefore an expanded SFDR when compared to the resulting SFDR if the original signal S were converted. FIG. 3d shows the clipped portion D* of the original signal S (FIG. 3a) which is represented as 180 degrees out of phase with the signal distortion D (FIG. 3c). The distortion D* is on the second path 18, and the second DAC 14 converts the distortion D* into analog form. The amplitude of the clipped portion D* has an amplitude which should result in an acceptable SFDR for the second DAC 14 (with a low amplitude of spurious distortion). Finally, the converted composite signal S' and D' is combined with the converted distortion D*' to generate the converted original signal S' with a low amplitude of spurious distortion, thereby providing an expanded SFDR. For discussion purposes, the input signal on the first path 16 is referred to as S and the clipped signal as a composite signal of S and D. On the second path 18, the input signal S is combined with the composite signal S with signal distortion D to isolate the signal distortion D on the second path 18. It should be understood that different notations, references and characterizations of the various signals can be used. The above designations were chosen to simplify the explanation of the invention.

Figure 4:
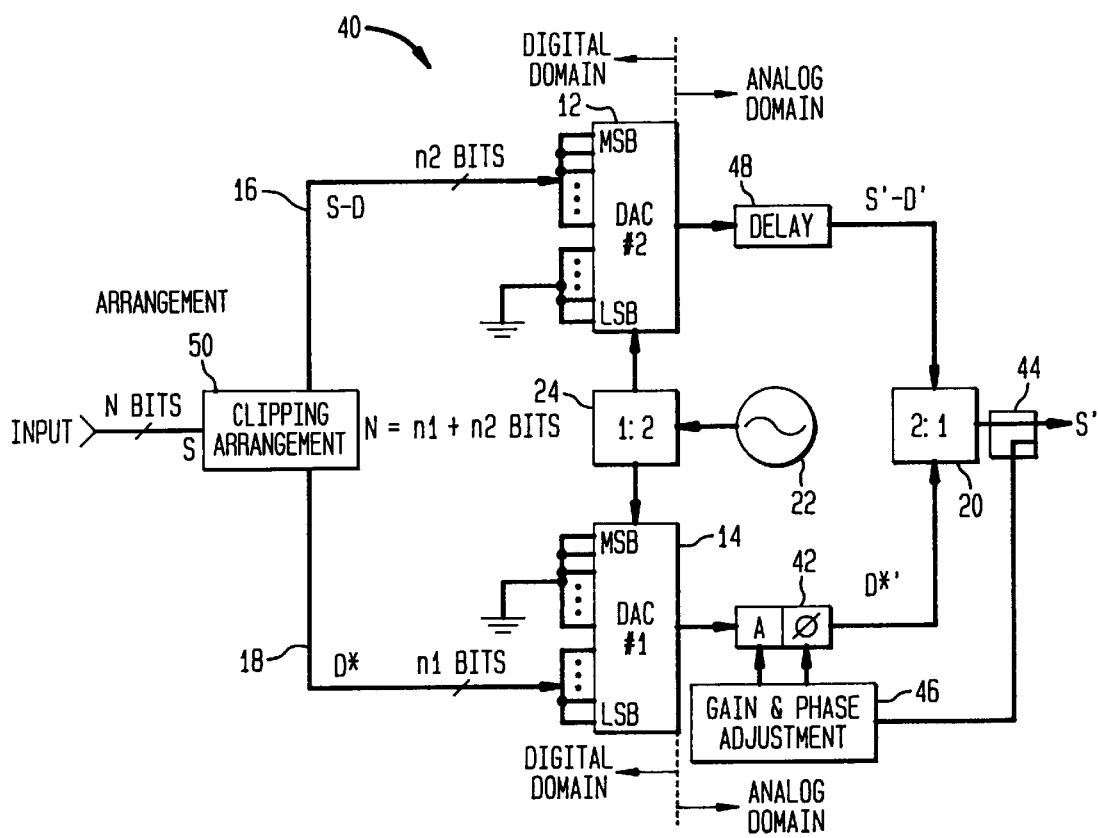
FIG. 4 shows a more detailed embodiment of the DAC system.

FIG. 4 shows an embodiment of a DAC system 40 which uses a phase and amplitude adjuster 42 on the second path 18 to adjust the phase and amplitude of the converted distortion D*'. The phase and amplitude adjuster 42 adjusts the phase and amplitude of the converted distortion D*' to improve the reduction of the converted signal distortion D', thereby improving the reconstruction of the desired converted analog signal S. The reduction of the converted signal distortion D' is improved as the converted signal distortions D' and D*' approach a 180 degree phase difference and the same amplitudes. The degree of cancellation of the converted distortions D' and D*' to be achieved depends upon the particular application, but complete cancellation is typically not required. For example, a 175–185 degree phase difference and/or 2 dB amplitude difference is possible between the converted signal distortions D* and D'* to achieve sufficient cancellation. In some embodiments, a coupler 44 at the output of the combiner or summer 20 provides a portion of the output signal S' to gain and phase control circuitry 46. The phase and gain control circuitry 46 responds to the amplitude of the converted signal distortion D' remaining in the output signal S' by providing phase and amplitude adjustment signals to the phase and amplitude adjuster 42. The phase and amplitude adjuster 42 responds to the phase and amplitude adjustment signals by adjusting the phase and amplitude of the converted signal distortion D*' to fine tune the reduction of the signal distortion D' from the output signal S'. The adjustments can be calculated or in a look-up table based on measurements of the signal S, such as the power level of the signal distortion D' at the output of the DAC system 40. In some applications, the phase and amplitude adjustments could be constant, or based on measurements of the signal distortion D* prior to the adjuster 42 and/or of the signal distortion D' prior to the summer 20.

A delay 48 attempts to match the delays between the first and second paths 16 and 18. In particular for this embodiment, the delay 48 reflects the delay experienced by the signal distortion D*' through the phase and amplitude adjuster 42 because the components on both paths 16 and 18 are the same except for the phase and amplitude adjuster 42 on the second path 18. The delay 48 need not exactly equalize the delays of both paths 16 and 18, but the respective delays should be close enough (for example, a delay difference on the order of picoseconds) that the corresponding portions of the signal distortion D' on the first path 16 and the signal distortion D*' on the second path 18 can be combined at about 180 degrees out of phase. Ideally, the signal distortion D' on the first path 16 and the signal distortion D*' on the second path 18 are combined at about 180 degrees out of phase, but depending on the application, the signal distortions D' can be more or less than 180 degrees out of phase, for example a 175–185 degree phase difference between the converted signal distortions D' and D*' can be acceptable. Alternatively, the phase and amplitude adjuster 42 can be located on the first path 16, and the delay 48 can be located on the second path 18.

Figure 5A:
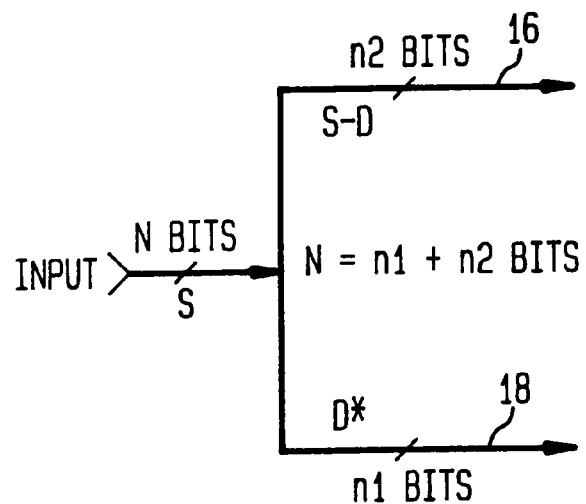
FIGS. 5a and 5b respectively show two embodiments of the clipping arrangement for the DAC system.

The DAC system 40 of FIG. 4 also shows a clipping arrangement 50 which clips the digital input signal S and routes the resulting signal S with the signal distortion D onto the first path 16 and the clipped signal distortion D* is routed onto the second path 18. The clipping arrangement 50 can be in a variety of forms. For example, FIG. 5a shows a clipping arrangement which receives the N bit digital input signal S. The "clipping" is performed by simply routing the n2 most significant bits along the first path 16 to the first DAC 12 (FIG. 4) and setting the remaining unused least significant inputs to the first DAC 12 to zero. The remaining least significant n1 bits of the digital input signal S are routed along the second path 18 to the second DAC 14 where the unused most significant inputs of the second DAC 14 are set to zero.

Figure 5B:
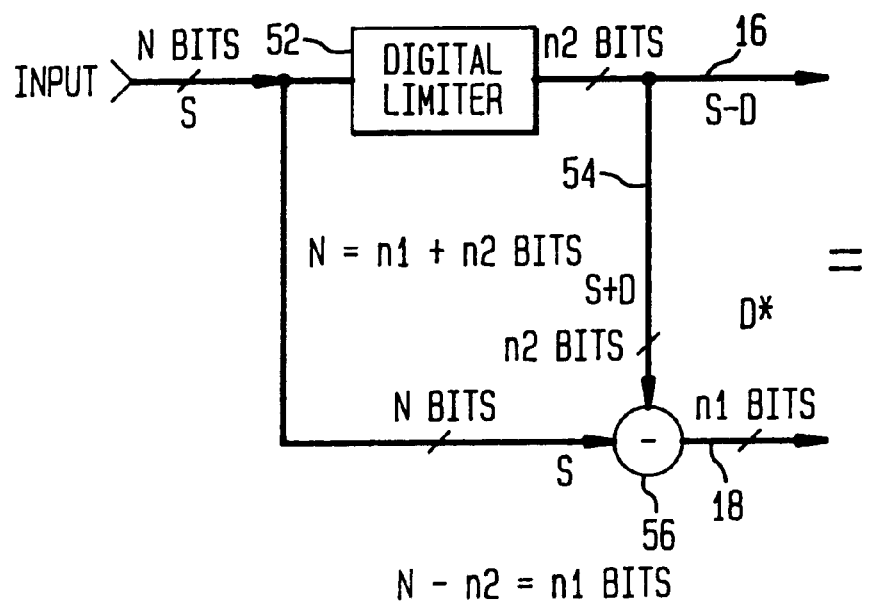

In FIG. 5b, the digital input signal S is split onto the first and second paths 16 and 18. On the first path 16, a digital limiter 52 clips the amplitude of the digital input signal S to prevent it from exceeding a certain "clipping" or adjustment level which would result in an unacceptable SFDR for the output of the first DAC 12 (FIG. 4). For the digital signal, the "clipping" or adjustment level can be measured in the number n2 of most significant bits for an N bit signal which the first DAC 12 can convert at the desired SFDR. In adjusting the amplitude of the digital input signal S, the digital limiter 52 produces the composite signal S and D representing the n2 most significant bits of the original signal S. The composite signal S with the signal distortion D can be provided to both the first path 16 and a third path 54. The signal S and signal distortion D on the third path 54 are subtracted from the digital input signal S on the second path 18 using a subtracting device 56. By subtracting the composite signal S and D representing the n2 MSBs of the digital input signal S from the N bit digital input signal S on the second path 18, this clipping arrangement leaves the signal distortion D* which corresponds to the n1 least significant bits that were removed by the digital limiter 52. In the frequency domain, all of the frequency components for the resulting signal distortion D* are about 180 degrees out of phase with the frequency components of the signal distortion D. Depending on the application, the digital limiter 52 can simply be implemented by disregarding the n1 LSBs if the N bit signal is above a clipping threshold level. The subtracting device 56 can be implemented in a variety of ways. The subtracting device 56 simply subtracts the n2 bits from the N bit signal, for example by XORing the corresponding bits as would be understood by one of skill in the art.

Figure 6:
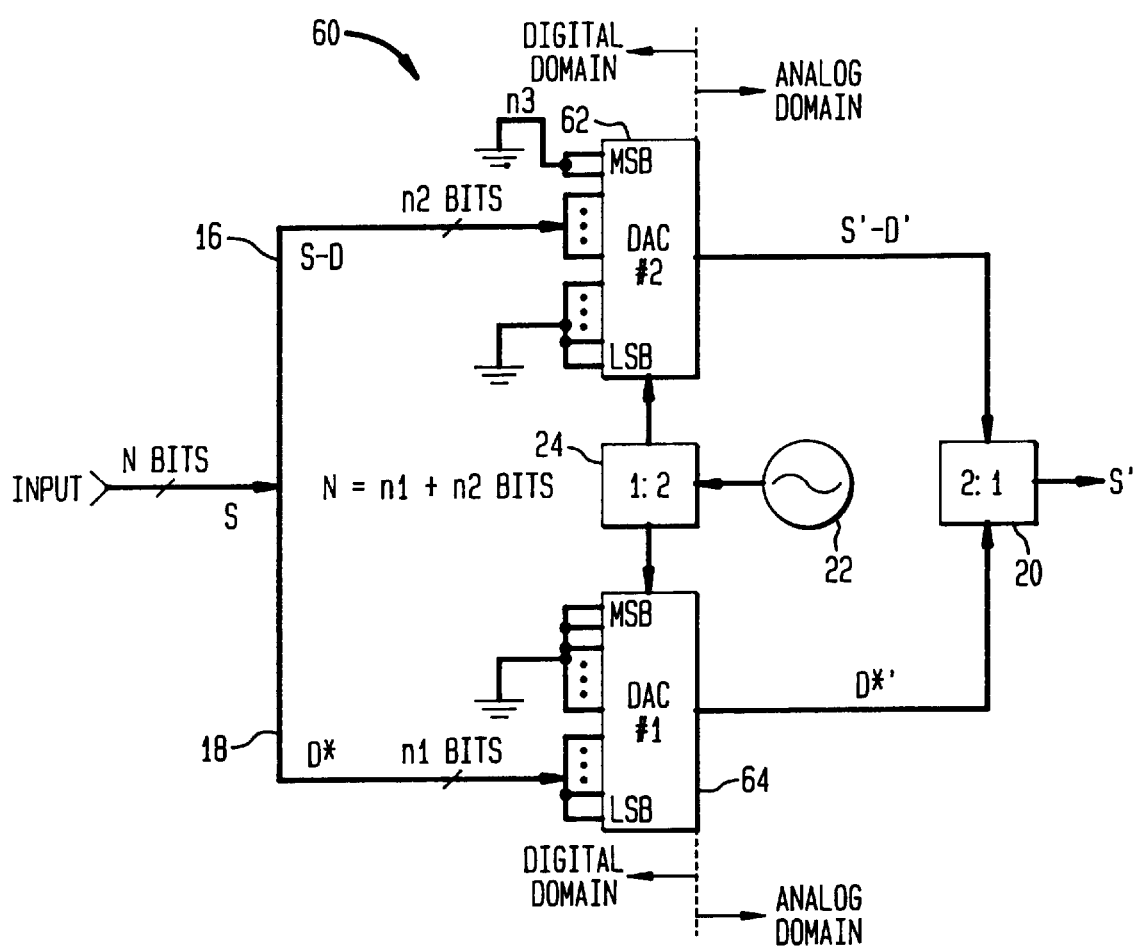
FIG. 6 shows another embodiment of the DAC system.

FIG. 6 shows a DAC system 60 which receives a digital input signal S comprising N bits. As in the embodiment of FIG. 1, the DAC system 60 splits the N bit signal into n2 most significant bits onto the first path 16 and n1 least significant bits onto the second path 18. The n1 least significant bits are routed to the least significant inputs of a second DAC 64, and the remaining most significant inputs are set to zero. The n2 most significant bits are routed to a first DAC 64. At the first DAC 62, the n1 least significant inputs are set to zero, and the remaining n2 most significant bits are applied to the corresponding inputs of the first DAC 62. The first DAC 62, however, has n3 more bit inputs than the N bits required by the digital input signal S. To further expand the SFDR of the first DAC 62 by decreasing the spurious free distortion level and increasing the relative difference between the highest output signal level and the spurious free distortion level, the n3 most significant bit inputs of the first DAC 62 are set to zero.

In addition to the embodiment described above, alternative configurations of the DAC system according to the principles of the present invention are possible which omit and/or add components and/or use variations or portions of the described system. The amount of amplitude difference, phase difference and delay difference which is tolerated between combining signals depends on the particular application and the corresponding tolerance permitted by the application. These operating design parameters also can determine which components can be added, changed or omitted. For example, the splitter 20 could be implemented by couplers or other devices. If a coupler is used, then a linear amplifier could be included on the path connected to the leg of the coupler with the higher loss. Additionally, the delay 48 can be implemented using passive devices, such as a passive filter, transmission line (coax, microstrip, or stripline), or active devices, such as amplifiers, active filters, digital delays or fiber, but active devices do introduce distortion.

As would be understood by one of ordinary skill in the art, the various components making up the DAC system and their respective operating parameters and characteristics should be properly considered in designing the DAC system. For example, the DACs can be the same type of DACs, but different types of DACs could be used. The SFDR as well as other operating parameters for the DACs should be considered in determining the adjustment level for the digital input signal. Depending on the various components of the DAC system, the SFDR can be changed. For example, the SFDR of the DAC arrangement can be theoretically doubled by using two DACs with the same SFDR. The DAC system could clip a digital input signal resulting in an output signal with twice the amplitudes of the highest output signals defining the SFDRs of the individual DACs in half to produce a second signal having an amplitude at the highest output signal level defining the SFDRs for the individual DACs. The clipped signal is converted by the first DAC to produce a converted clipped signal which has an amplitude at the highest output signal level defining the SFDR for the first DAC. The clipped amplitude portion of the input signal is put on a second path with the second DAC, and the second DAC converts the clipped amplitude portion to produce a converted clipped amplitude signal which has an amplitude at the highest output signal level defining the SFDR for the second DAC. As such, the converted clipped signal and the converted clipped amplitude portion can be combined at the output of the DAC system to have twice the amplitude of the highest output signal level defining the SFDR of each DAC, thereby providing about twice the SFDR although a 50% increase in the SFDR of the DAC system when compared to the individual SFDRs of the system DACs is more readily achievable.

Alternatively, a DAC or DACs with lower and/or different SFDRs could be used to provide a desired extended SFDR at lower cost. An extended SFDR results from an increase in the relative difference between highest output signal level and the corresponding spurious distortion level, for example by increasing the amplitude of the output signal of the DAC system (increasing the range of digital values which the DAC can convert) while maintaining or providing less of an increase in the corresponding distortion level, or from reducing the amplitude of the distortion while maintaining or providing less of a decrease in the amplitude of the output signal.

Furthermore, the DAC system has been described using a particular configuration of distinct components, but it should be understood that the DAC system and portions thereof can be implemented in application specific integrated circuits, software-driven processing circuitry, firmware or other arrangements of discrete components as would be understood by one of ordinary skill in the art with the benefit of this disclosure. Although the illustrative embodiment is shown with particular circuitry, the DAC system can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of converting a digital input signal to analog form, said digital input signal having an amplitude defined by N bits which produces a converted analog signal having a spurious free dynamic range (SFDR) for a first digital to analog converter (DAC) on a first path, said method comprising the steps of:

clipping the amplitude of said digital input signal on said first path so that the first DAC receives most significant bits of the N bits;

converting by said first DAC said most significant bits of the digital input signal on said first path to produce a first analog signal;

converting by a second DAC on a second path remaining bits of said N bits of the digital input signal to produce a second analog signal; and combining said first analog signal with said second analog signal to produce a converted analog signal, wherein the converted analog signal has an SFDR greater than the SFDR of the first DAC; and said step of clipping including the steps of:

routing n2 bits of said digital input signal as the most significant bits of the N bits onto said first path as a digital signal and a distortion adjustment signal; and routing n1 bits of said digital input signal as the remaining bits of the N bits onto said second path as a distortion signal 180° out of phase with the distortion adjustment signal.

2. The method of claim 1 wherein said step of converting by said first DAC includes the step of converting said digital signal and said distortion adjustment signal on said first path to the first analog signal, said step of converting by said second DAC includes the step of converting said distortion signal on said second path to the second analog signal and said step of combining said first and second analog signals includes combining said converted digital signal and said converted distortion adjustment signal with said converted distortion signal to produce the converted analog signal.

3. The method of claim 2 wherein said steps of converting include the step of:
using a sampling signal having a certain frequency for said steps of converting.

4. The method of claim 3 wherein the step of combining includes:
combining said distortion signal on said second path with said distortion adjustment signal on said first path.

5. The method of claim 3 wherein said step of converting by said first DAC includes the step of converting said distortion adjustment signal on said first path to a first analog signal on said first path, said step of converting by said second DAC includes the step of converting said distortion signal on said second path to produce a second analog signal on said second path and said step of combining said first and second analog signals combines said first analog signal with said second analog signal.

6. The method of claim 5 wherein said steps of converting include the step of:
using a sampling signal having a certain frequency for said steps of converting.

7. The methods of claim 5 further including the steps of:
equalizing the delays on said first and second paths.

8. The method of claim 5 further including the step of:
adjusting a relative amplitude and phase difference between said first analog signal and said second analog signal.

9. The methods of claim 2 further including the steps of:
equalizing the delays on said first and second paths.

10. The method of claim 2 further including the step of:
adjusting a relative amplitude and phase difference between said first analog signal and said second analog signal.

11. A digital to analog converter (DAC) system for converting a digital input signal to a converted analog signal, said digital input signal having N bits which define an amplitude for the digital input signal having a spurious free dynamic range (SFDR) for a first DAC on a first path, said DAC system comprising:
a clipping arrangement that receives said digital input signal and adjusts the amplitude of said digital input signal to produce a digital signal and a distortion adjustment signal on said first path and a distortion signal on said second path;
said first DAC on said first path receiving said digital signal and said distortion adjustment signal on said first path and converting said digital signal and said distortion adjustment signal on said first path to a first analog signal;
a second DAC on a second path receiving said distortion signal on said second path and converting said distortion signal on said second path to a second analog signal; and
a combiner coupled to said first and second paths that combines said first analog signal with said second analog signal to produce a converted analog signal, wherein the converted analog signal has an SFDR greater than the SFDR for the first DAC.

12. The system of claim 11 wherein said clipping arrangement routes n2 bits of said digital input signal as said digital signal and said distortion adjustment signal on said first path and routes n1 bits of said digital input signal as distortion on said second path.

13. The system of claim 12 wherein said first DAC on said first path converts said digital signal and said distortion adjustment signal on said first path to a first analog signal and said second DAC on said second path converts said distortion signal on said second path to a second analog signal and said combiner combines said first analog signal with said second analog signal to produce the converted analog signal.

14. The system of claim 11 wherein said clipping arrangement includes:
a first path branch that provides said digital input signal onto the first path and the second path; and
a digital limiter on said first path that limits the amplitude of said digital input signal to produce the digital signal and the distortion adjustment signal on said first path.

15. The system of claim 14 further including:
a second path branch on said first path that provides said digital signal and said distortion adjustment signal on said first path to a third path.

16. The system of claim 15 including:
a second DAC on said second path that receives said distortion signal on said second path and converts said distortion signal to a second analog signal on said second path.

17. A method of converting a digital input signal to analog form, said digital input signal having an amplitude defined by N bits, said method comprising the steps of:
routing n2 bits of said digital input signal as most significant bits of the N bits onto a first path to a first DAC as a digital signal and a distortion adjustment signal;
routing n1 bits of said digital input signal as remaining bits of the N bits onto a second path to a second DAC as a distortion signal;
converting by said first DAC said most significant bits to produce a first analog signal;
converting by said second DAC said remaining bits to produce a second analog signal;
providing a sampling signal to said first DAC and said second DAC to provide synchronous sampling; and
combining said first analog signal with said second analog signal to produce a converted analog signal.

18. The method of claim 17 wherein the distortion signal is 180° out of phase with the distortion adjustment signal.

19. A digital to analog converted (DAC) system for converting a digital input signal comprised of N bits to an analog signal, said DAC system comprising:
a first DAC that receives a digital signal and a distortion adjustment signal consisting of most significant bits of the N bits on a first path, and that converts said digital signal and said distortion adjustment signal on said first path to a first analog signal;
a second DAC that receives a distortion signal consisting of remaining bits of the N bits on a second path, and that converts said distortion signal on said second path to a second analog signal;
a splitter that provides a sampling signal to the first DAC and the second DAC to provide synchronous sampling; and a combiner connected to said first path and said second path that combines said first analog signal with said second analog signal to produce a converted analog signal.

20. The system of claim 19 wherein the distortion signal is 180° out of phase with the distortion adjustment signal.

21. A method of converting a digital input signal to analog form, said digital input signal having an amplitude defined by N bits, said method comprising the steps of:
   routing n2 bits of said digital input signal as most significant bits of the N bits onto a first path to a first DAC as a digital signal and a distortion adjustment signal;
   routing n1 bits of said digital input signal as remaining bits of the N bits onto a second path to a second DAC as a distortion signal;
   converting by said first DAC said most significant bits to produce a first analog signal;
   converting by said second DAC said remaining bits to produce a second analog signal;
   adjusting phase and amplitude of the second analog signal;
   providing a sampling signal to said first DAC and said second DAC to provide synchronous sampling;
   matching delays on said first path and said second path; and
   combining said first analog signal with said adjusted second analog signal to produce a converted analog signal.

22. The method of claim 21 further comprising:
   providing a portion of the converted analog signal; and
   obtaining phase and amplitude adjustment signals to adjust the phase and amplitude using the portion of the converted analog signal.

23. The method of claim 21 wherein the distortion signal is 180° out of phase with the distortion adjustment signal.

24. A digital to analog converted (DAC) system for converting a digital input signal comprised of N bits to an analog signal, said DAC system comprising:
   a first DAC that receives a digital signal and a distortion adjustment signal consisting of most significant bits of the N bits on a first path, and that converts said digital signal and said distortion adjustment signal on said first path to a first analog signal;
   a second DAC that receives a distortion signal consisting of remaining bits of the N bits on a second path, and that converts said distortion signal on said second path to a second analog signal;
   a phase and amplitude adjuster that adjusts phase and amplitude of the second analog signal;
   a splitter that provides a sampling signal to the first DAC and the second DAC to provide synchronous sampling;
   a delay that matches delays on said first path and said second path; and
   a combiner connected to said first path and said second path that combines said first analog signal with said adjusted second analog signal to produce a converted analog signal.

25. The system of claim 24 further comprising:
   a coupler connected to the combiner that provides a portion of the converted analog signal; and
   a phase and gain circuitry that receives the portion of the converted analog signal, and that provides phase and amplitude adjustment signals to the phase and amplitude adjuster based on the portion of the converted analog signal.

26. The system of claim 24 wherein the distortion signal is 180° out of phase with the distortion adjustment signal.

27. A method of converting a digital input signal to analog from, said digital input signal having an amplitude defined by N bits, said method comprising the steps of:
   routing n2 bits of said digital input signal as most significant bits of the N bits onto a first path to a first DAC as a digital signal and a distortion adjustment signal, the first DAC having n3 bits more than the N bits;
   setting n1 least significant inputs and n3 most significant bit inputs at the first DAC to zero;
   routing n1 bits of said digital input signal as least significant bits of the N bits onto a second path to a second DAC as a distortion signal;
   setting n2 most significant bit inputs at the second DAC to zero;
   converting by said first DAC said most significant bits to produce a first analog signal;
   converting by said second DAC said remaining bits to produce a second analog signal;
   providing a sampling signal to said first DAC and said second DAC to provide synchronous sampling; and
   combining said first analog signal with said second analog signal to produce a converted analog signal.

28. The method of claim 27 wherein the distortion signal is 180° out of phase with the distortion adjustment signal.

29. A digital to analog converted (DAC) system for converting a digital input signal comprised of N bits to an analog signal, said DAC system comprising:
   a first DAC that receives a digital signal and a distortion adjustment signal consisting of n2 most significant bits of the N bits on a first path, and that converts said digital signal and said distortion adjustment signal on said first path to a first analog signal, the first DAC having n3 bits more than the N bits, the first DAC setting n1 least significant inputs and n3 most significant bit inputs to zero;
   a second DAC that receives a distortion signal consisting of n1 least significant bits of the N bits on a second path, and that converts said distortion signal on said second path to a second analog signal, the second DAC setting n2 most significant inputs to zero;
   a splitter that provides a sampling signal to the first DAC and the second DAC to provide synchronous sampling; and
   a combiner connected to said first path and said second path that combines said first analog signal with said second analog signal to produce a converted analog signal.

30. The system of claim 29 wherein the distortion signal is 180° out of phase with the distortion adjustment signal.

31. A method of converting a digital input signal comprised of N bits to an analog signal having a spurious free dynamic range (SFDR) for a first digital to analog converter (DAC), said method comprising:
   clipping the amplitude of said digital input signal on a first path to produce a composite signal of most significant bits of the N bits;
   routing a distortion signal comprising remaining N bits of the digital input signal onto a second path;
   converting by said first DAC said composite signal on said first path to a first analog signal;
   converting by a second DAC said distortion signal on said second path to a second analog signal; and combining said second analog signal with said first analog signal to produce a converted analog signal, wherein the converted analog signal has an SFDR greater than the SFDR for the first DAC.

32. A digital to analog converted (DAC) system for converting a digital input signal comprised of N bits to an analog signal, said DAC system comprising:

a clipping arrangement that receives said digital input signal and adjusts the amplitude of said digital input signal to produce a digital signal and a distortion adjustment signal on a first path so that the digital signal and the distortion adjustment signal consist of most significant bits of the N bits; and a first DAC on said first path that receives said digital signal and said distortion adjustment signal on said first path and converts said digital signal and said distortion adjustment signal on said first path to a first analog signal;

a second path that carries a distortion signal comprising remaining N bits of the digital input signal;

a second DAC on said second path that converts said distortion signal on said second path to a second analog signal; and a combiner connected to said first and second paths that combines said first analog signal with said second analog signal to produce a converted analog signal, wherein the converted analog signal has an SFDR greater than the SFDR of the first DAC; and said clipping arrangement:

routes n2 bits of said digital input signal as the most significant bits of the N bits onto said first path as a digital signal and a distortion adjustment signal; and routes n1 bits of said digital input signal as the remaining bits of the N bits onto said second path as a distortion signal 180° out of phase with the distortion adjustment signal.

* * * * *